US006498730B2

(12) United States Patent
Centola et al.

(10) Patent No.: US 6,498,730 B2
(45) Date of Patent: Dec. 24, 2002

(54) APPARATUS AND METHOD FOR INSERTING, RETAINING AND EXTRACTING PRINTED CIRCUIT BOARDS

(75) Inventors: Bruno Centola, De Provence Vence (FR); Claude Gomez, Antibes (FR); Christian Ouazana, St Laurent du Var (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/016,444

(22) Filed: Dec. 10, 2001

(65) Prior Publication Data

US 2002/0071255 A1 Jun. 13, 2002

(30) Foreign Application Priority Data

Dec. 13, 2000 (EP) .............................................. 00480116

(51) Int. Cl.[7] .................................................. H05K 5/00
(52) U.S. Cl. ...................... 361/759; 361/756; 361/785; 439/310
(58) Field of Search ................................ 361/752, 754, 361/756, 759, 785, 798, 801–803; 439/64, 310, 160, 362, 157, 153, 257; 211/41.17

(56) References Cited

U.S. PATENT DOCUMENTS

| 3,727,677 | A | * | 4/1973 | Thomas ....................... 164/131 |
| 3,963,317 | A | * | 6/1976 | Eigenbrode et al. ........ 439/267 |
| 5,115,376 | A | * | 5/1992 | Nakajima ................. 211/41.17 |
| 5,171,154 | A | * | 12/1992 | Casciotti et al. ............. 439/260 |
| 5,637,001 | A | * | 6/1997 | Nony et al. .................. 235/482 |
| 5,964,031 | A | * | 10/1999 | Smith et al. ................. 269/903 |

* cited by examiner

Primary Examiner—Jayprakash N. Gandhi
Assistant Examiner—Thanh S. Phan
(74) Attorney, Agent, or Firm—Lawerance R. Fraley

(57) ABSTRACT

An apparatus and method for inserting and extracting printed circuit boards from a housing using screwing devices. A connector on the printed circuit board includes two tapped holes that cooperate with two threaded shafts held by the housing. The threaded shafts are operatively coupled to a common control shaft in such a way that rotating the control shaft in turn rotates the threaded shafts. Depending upon the rotation direction, the threaded shafts either screw or unscrew within the tapped holes so that the printed circuit board coupled to the connector is inserted or extracted.

12 Claims, 6 Drawing Sheets

APPARATUS AND METHOD FOR INSERTING, RETAINING AND EXTRACTING PRINTED CIRCUIT BOARDS

FIELD OF THE INVENTION

The present invention relates to apparatus and methods for inserting, retaining and extracting printed circuit boards from a housing and more particularly for inserting, retaining and extracting a printed circuit board wherein a relatively strong force is required, in addition to a high degree of accuracy in positioning the corresponding contacts.

BACKGROUND OF THE INVENTION

As is known, printed circuit boards (PCBs) are a common form of electrical circuit packaging. Today, many electrical systems like computers, routers and switchers are based on a housing containing a backplane (circuit board) comprising active devices and at least one slot to connect a respective PCB (usually more than one PCB is connected to such a backplane). PCBs are linked to the backplane with connectors, located on the PCB's lower edge and a corresponding backplane surface, through which signals are transmitted. These connectors must meet specific electrical and mechanical requirements, e.g., signals must be transmitted without deformation and at high speed. The PCBs must be able to be inserted and extracted relatively easily and must be retained so that necessary electrical connections are maintained.

A known mechanism to insert and extract PCBs from a housing consists of lever arms disposed on each upper side edge of the PCB which in turn cooperate with the housing. Such a mechanism is described in U.S. Pat. No. 4,914,552. The apparatus includes a lever mounted on the board and a cooperating gear assembly carried by the board and the housing for use in manually installing the board in, or removing the board from, the housing. A conventional locking wedge assembly can be manually operated by the same lever, to retain the PCB within the housing after its installation.

The present electronic packaging engineering practice is to increase the number of Input/Output (I/O) contacts (pins and sockets) for these structures, which in turn results in an increasing size for these PCBs. As a result, the mechanical packaging of these structures is more costly from both a development and manufacturing standpoint. As the number of electrical contacts increases, the force required to insert or extract a board from a housing increases correspondingly. Furthermore, the accuracy that is required in mating the connectors is more difficult to achieve because of the greater number of more closely positioned contacts that must be simultaneously made. In addition, each of the electrical contacts can be easily damaged by improper insertion. As a result, the effective installation and the removal of a PCB from such a backplane poses a significant engineering challenge.

It is believed, therefore, that an improved means for inserting and removing a PCB relative to a backplane would constitute an advancement in the art.

Objects and Summary of the Invention

It is, therefore, a primary object of the present invention to provide an enhancement in the art of inserting and removing PCBs from backplane (and related) structures.

It is another object of the present invention to provide an apparatus that can withstand the relatively strong forces required to insert or remove a PCB in a housing including a backplane board therein.

It is another object of the invention to provide an apparatus for inserting or removing a PCB from a housing that provides a high degree of accuracy in aligning the mating electrical contacts.

The accomplishment of these and other related objects is achieved by an apparatus for positioning a PCB within a housing and for removing the PCB from said housing in which the PCB includes at least one connector positioned thereon and having a threaded opening therein. The housing includes a connector for coupling to the PCB connector. The apparatus comprises a a control shaft adapted for being rotatively moved in first and second opposing directions and at least one threaded shaft operatively coupled to the control shaft and adapted for being screwed into the at least one threaded opening in the at least one connector on the PCB during movement of the control shaft in the first direction to draw the PCB toward the at least one connector in the housing such that the at least one connector on the PCB will be electrically connected to the at least one connector within the housing, the at least one threaded shaft also adapted for being unscrewed from the at least one threaded opening during movement of the control shaft in the second direction to move the PCB away from the at least one connector within the housing such that the PCB will be disconnected from the at least one connector within the housing.

According to yet another aspect of the invention, there is provided a PCB having at least one connector positioned thereon along a lower edge of the PCB and including at least one threaded opening therein oriented substantially perpendicular to the lower edge.

Further advantages of the present invention will become apparent to one skilled in the art upon examination of the following drawings and detailed description. It is intended that any additional advantages be incorporated herein.

BRIEF DESCRIPTION OF THE DRAWINGS

FIG. 5 shows the steps of the algorithm that illustrates the method of the invention to insert a PCB within a housing or similar structure including a backplane board or the like;

BEST MODE FOR CARRYING OUT THE INVENTION

The preferred embodiments of the invention as defined below concern the use of PCBs for routing or switching systems that require great numbers of electrical connections and high speed signal transmissions, and more specifically, those wherein press-fit or the like connectors are used. Nevertheless, it is to be understood that the invention can be put in use with several various other types of backplane or the like connector structures.

Figure 1:
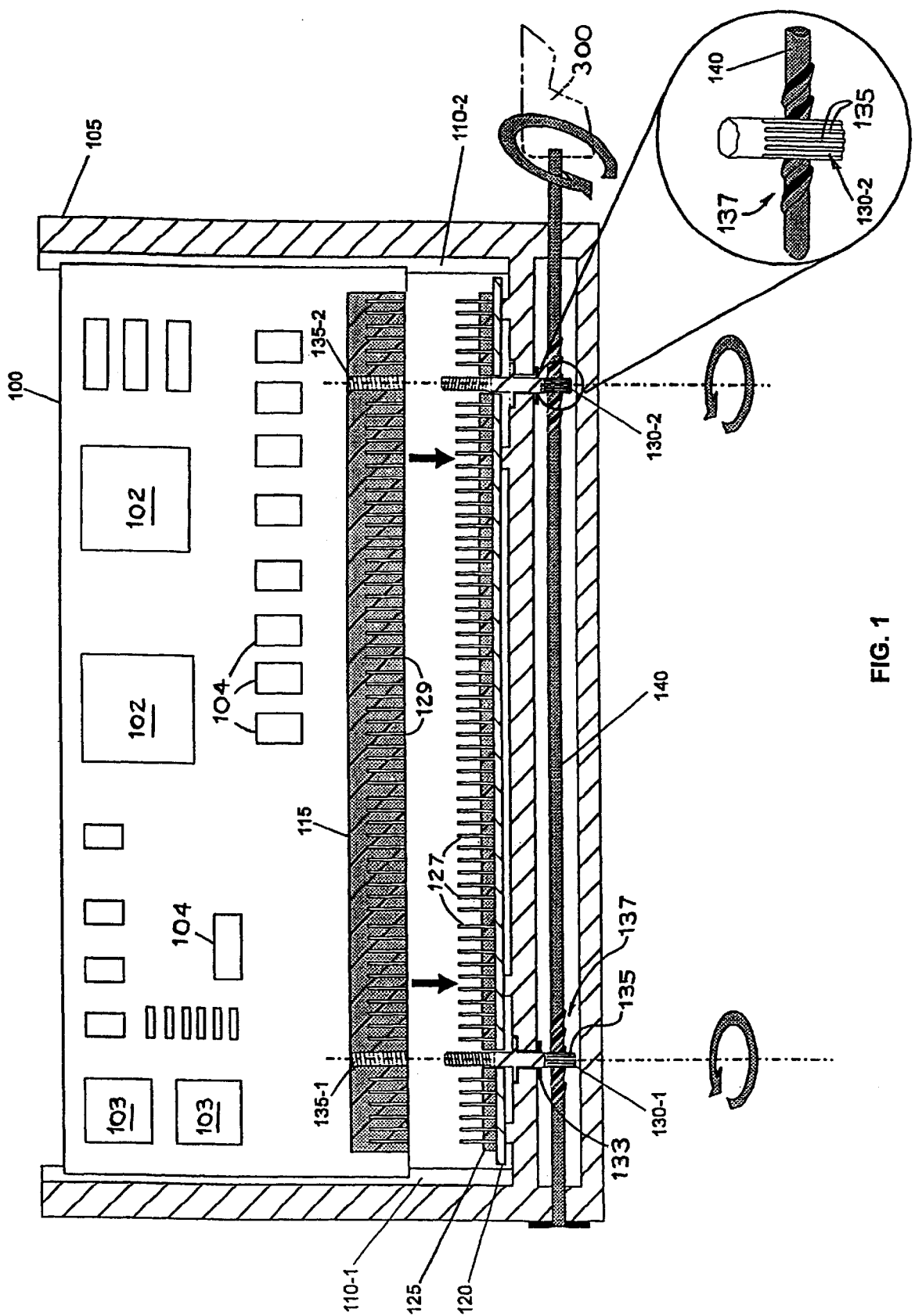
FIG. 1 illustrates a front elevational view of an apparatus which is used to insert and remove a PCB from a housing, in accordance with one embodiment of the invention.
Figure 2:
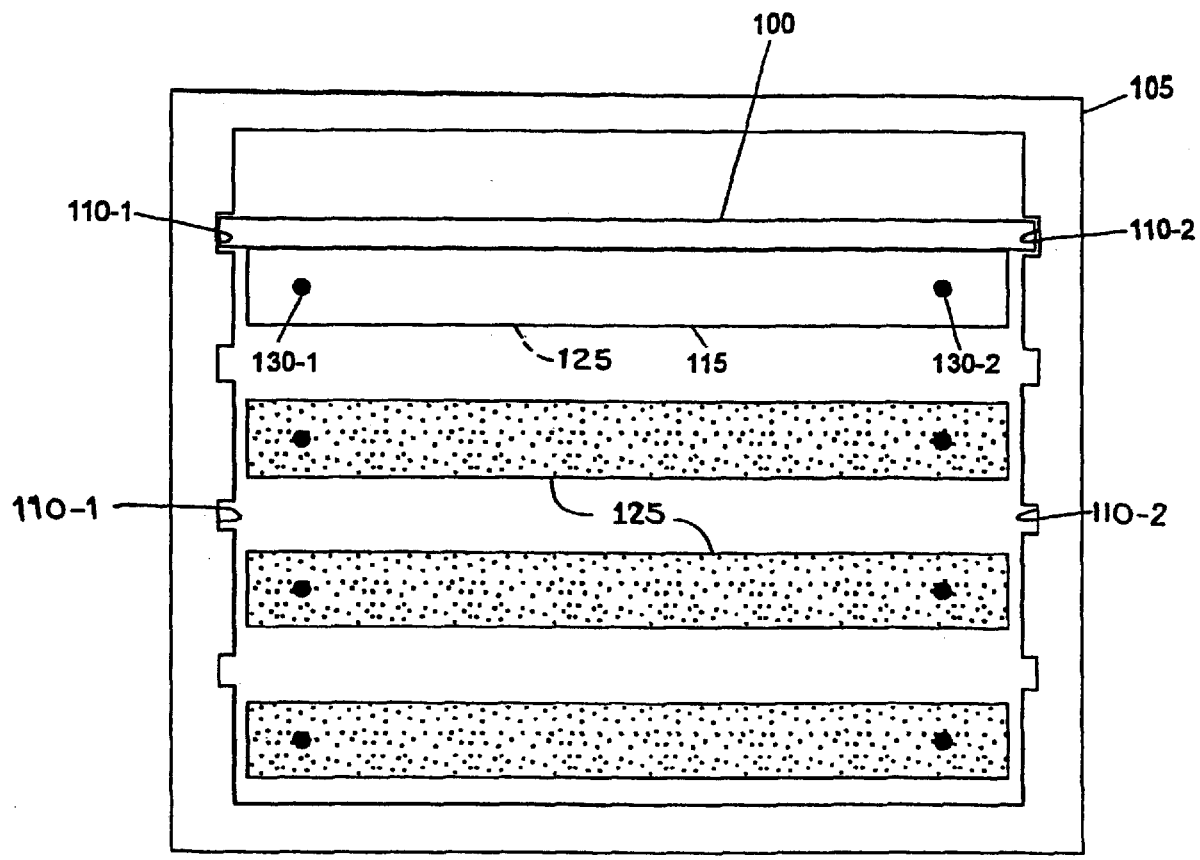
FIG. 2 depicts a top, plan view of the housing of FIG. 1.

With reference now to the drawing, and particularly to FIGS. 1 and 2, there is shown a printed circuit board (PCB) 100 and a housing 105 comprising cavities (or slots) 110-1 and 110-2 adapted to receive PCB 100. As depicted in FIG. 1, various electronic devices 102, 103 and 104 are positioned on PCB 100, which also includes a connector 115 positioned on its lower edge. Housing 105 includes a backplane PCB 120 that in turn includes connectors 125 to receive each of the PCBs desired to be positioned in housing 105. As seen in FIG. 2, up to four PCBs can be inserted into housing 105, each for coupling with a respective connector 125 on backplane PCB 120. The backplane may further include its own electronic active or passive devices, e.g. drivers or memories. The male connectors 125 carried by backplane PCB 120 are arranged such that each is aligned with a respective female connector 115 of the incoming PCB when the PCB is inserted within a respective cavity pair 110-1, 110-2. In particular, backplane 120 comprises connectors 125 with upstanding pins 127 that mate with female openings 129 in connectors 115. Housing 105 further comprises two shafts 130-1 and 130-2, arranged substantially perpendicularly with regard to the backplane PCB 120. Connector 115 includes two holes 135-1 and 135-2, perpendicular to the contacting surface of connector 115 so that holes 135-1 and 135-2 face and are aligned with shafts 130-1 and 130-2 respectively. The upper parts of shafts 130-1 and 130-2 are threaded and the holes 135-1 and 135-2 tapped so that shafts 130-1 and 130-2 can be screwed into the respective holes 135-1 and 135-2. Shafts 130-1 and 130-2 are held in housing 105 in such a way that these can only have a rotational movement. For example, shafts 130-1 and 130-2 can be held in place by washers or circlips 133 as depicted in FIG. 1. The lower parts of shafts 130-1 and 130-2 each include a plurality of longitudinal channels 135. A control shaft 140 disposed in a parallel direction with connector 125 in housing 105 includes two threaded parts 137 (see especially the enlarged part of FIG. 1), in contact with the longitudinal channels 135 of shafts 130-1 and 130-2, such that rotation of control shaft 140 causes shafts 130-1 and 130-2 to rotate. See the relative directions of rotation represented by the three large, curved arrows in FIG. 1.

The apparatus described in FIGS. 1 and 2 is able to effectively insert or remove a PCB 100 with a high degree of accuracy by precisely aligning the pins and corresponding openings. To insert PCB 100, the apparatus user must insert the board into cavities 110-1 and 110-2 in the right position, i.e. the lower part of the board carrying the connector must be inserted first. When connector 115 first engages the shafts 130-1 and 130-2, the user next turns the control shaft 140 such that threaded shafts 130-1 and 130-2 screw into the tapped holes 135-1 and 135-2 respectively. This occurs until connectors 115 and 125 are coupled together (connector 115 being fully seated upon connector 125 with pins 127 inserted within openings 129). To extract (remove) PCB 100, the user simply has to turn control shaft 140 in the opposite direction (referred to as the upward direction) and thereby unscrew shafts 130-1 and 130-2 from tapped holes 135-1 and 135-2 respectively.

Figure 3:
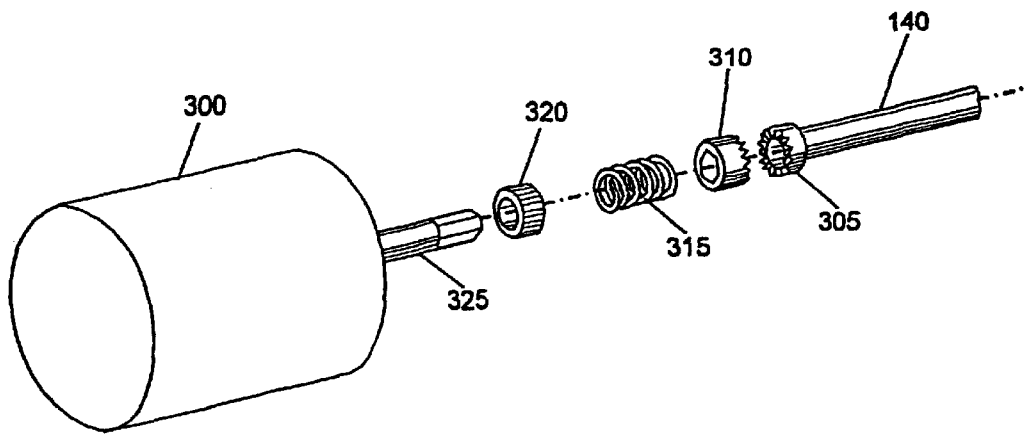
FIG. 3 illustrates the use of a motor and a mechanical clutch in conjunction with the apparatus of FIG. 1 to automatically insert or remove a PCB.

In a preferred embodiment, control shaft 140 is coupled to a motor (300 in phantom in FIG. 1; see also FIG. 3) so that PCB 100 may be automatically inserted or removed. FIG. 3 illustrates the control shaft 140 and an electrical motor 300. In this example, a mechanical clutch is used between electrical motor 300 and control shaft 140 to avoid any damage. The clutch comprises two clutch heads 305 and 310, a compression spring 315 and a washer 320. Clutch head 305 is part of control shaft 140 and clutch head 310 is urged into contact with clutch head 305 by compression spring 315. The motor shaft 325 is such that clutch head 310 cannot rotate independently but may move along its axis. In a preferred embodiment, the teeth of the clutch heads are not symmetrical such that the torque required during screwing into connector 115 to draw it toward connector 125 is less than the torque required during unscrewing (separating 115 from 125).

Figure 4:
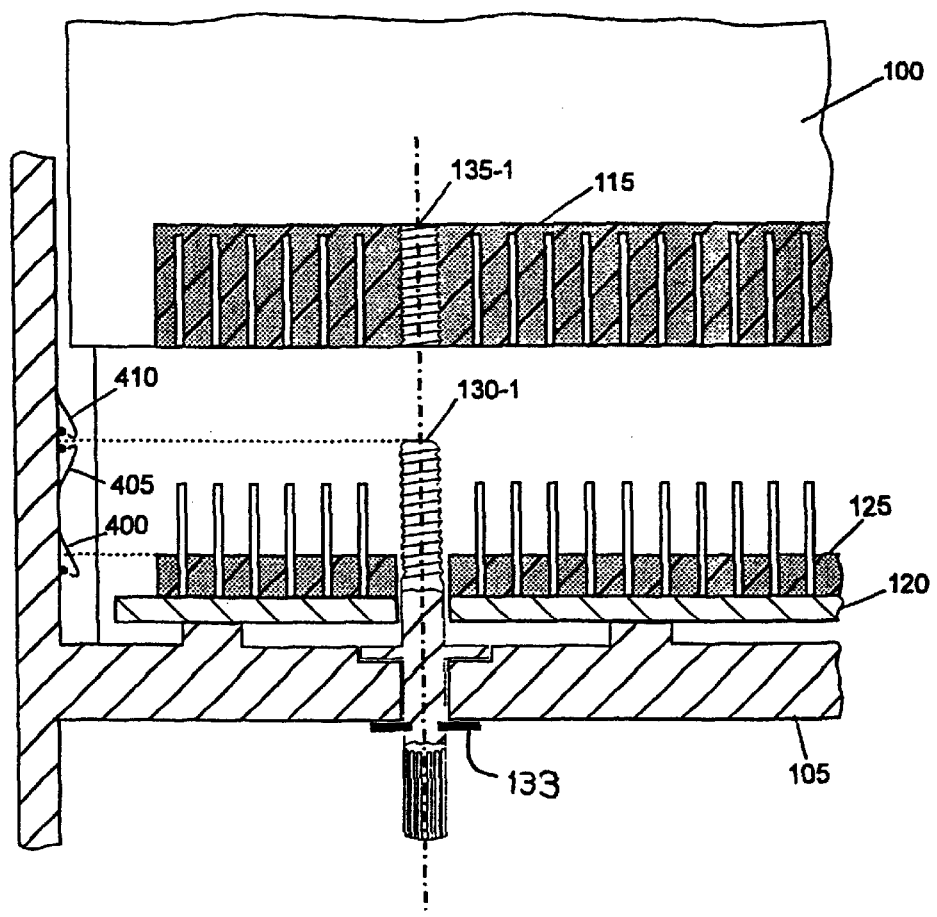
FIG. 4 is a partial, enlarged view of the embodiment of FIG. 1 on which electrical switches are used to determine the position of the PCB.

FIG. 4 is an enlarged partial, detailed view of the automated mechanism illustrated in FIG. 1 that further includes electrical switches used to determine the position of PCB 100 and to control motor 300. Three depressible switches 400, 405 and 410 are spacedly positioned along a wall of cavity 110-1. Switch 400 is aligned with the upper edge of connector 125, and switches 405 and 410 are aligned slightly below and above the uppermost end surface of shaft 130-1 (and 130-2), respectively. Understandably, these switches determine the control shaft 140 rotation direction, e.g., causing PCB 100 to move either in an upward or downward direction, and the drive motor to start or stop. Thus the board can be automatically inserted (moved downward in FIG. 4) after having been detected by the first switch 410. Similarly, actuation of a single switch will result in board removal (upward movement) until it disengages the top (first) switch 410, when the motor will automatically stop. FIG. 4 also better illustrates the aforementioned washer or circlip 133 orientation on shaft 130-1 relative to housing 105 and connector 125.

To avoid electrical shock, it is important to take some additional actions, e.g. concerning power supply or logic circuitry activation/deactivation, after having inserted PCB 100 in housing 105 or before extracting the PCB from the housing. Usually, power supply and logic circuitry are switched in two steps. The control of these two functions may be combined with the above switches so that these are automatically executed when a board is being inserted within or withdrawn from housing 105.

Figure 5:
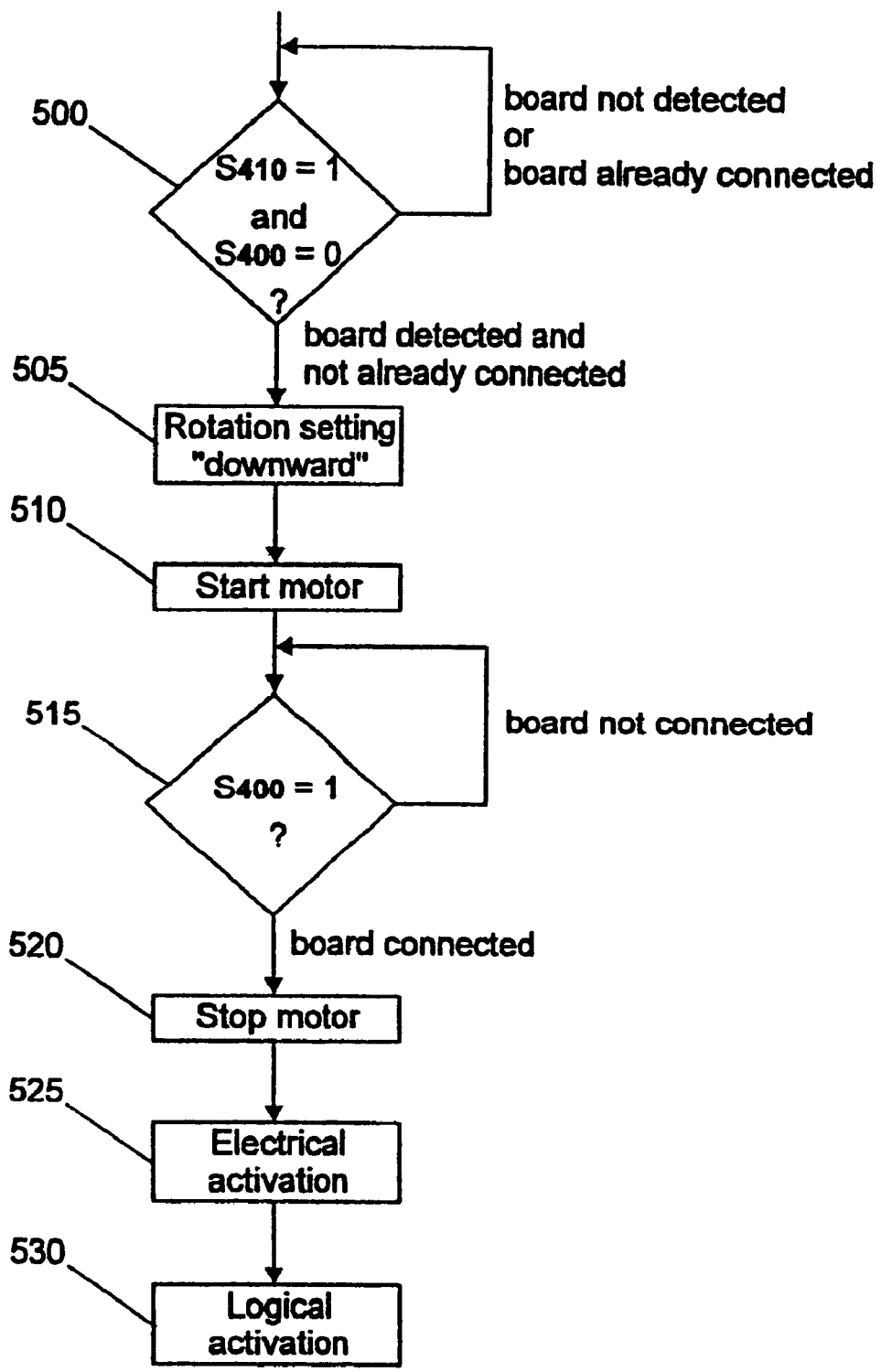

FIG. 5 shows the main steps of the algorithm that illustrates one embodiment of the method of the invention to position a PCB in a housing. When no PCB is inserted, switch 400 value is equal to 0. Switch 410 now detects the incoming PCB in cavity 110-1, switch 410 giving a value equal to 1. This is step 500 in FIG. 5. The shaft 140 rotation direction is then set as "downward" (step 505) and motor 300 is activated (step 510). A loop is provided to assure PCB 100 is fully inserted (step 515), e.g., shafts 130-1 and 130-2 are fully screwed to the desired depth within holes 135-1 and 135-2, whereupon switch 400 detects that connector 115 has mated with connector 125. At this point, switch 400 is of a value equal to 1 (step 520). Being fully positioned in housing 105, PCB 100 is now electrically activated (step 525), including its logic circuitry (step 530).

Figure 6:
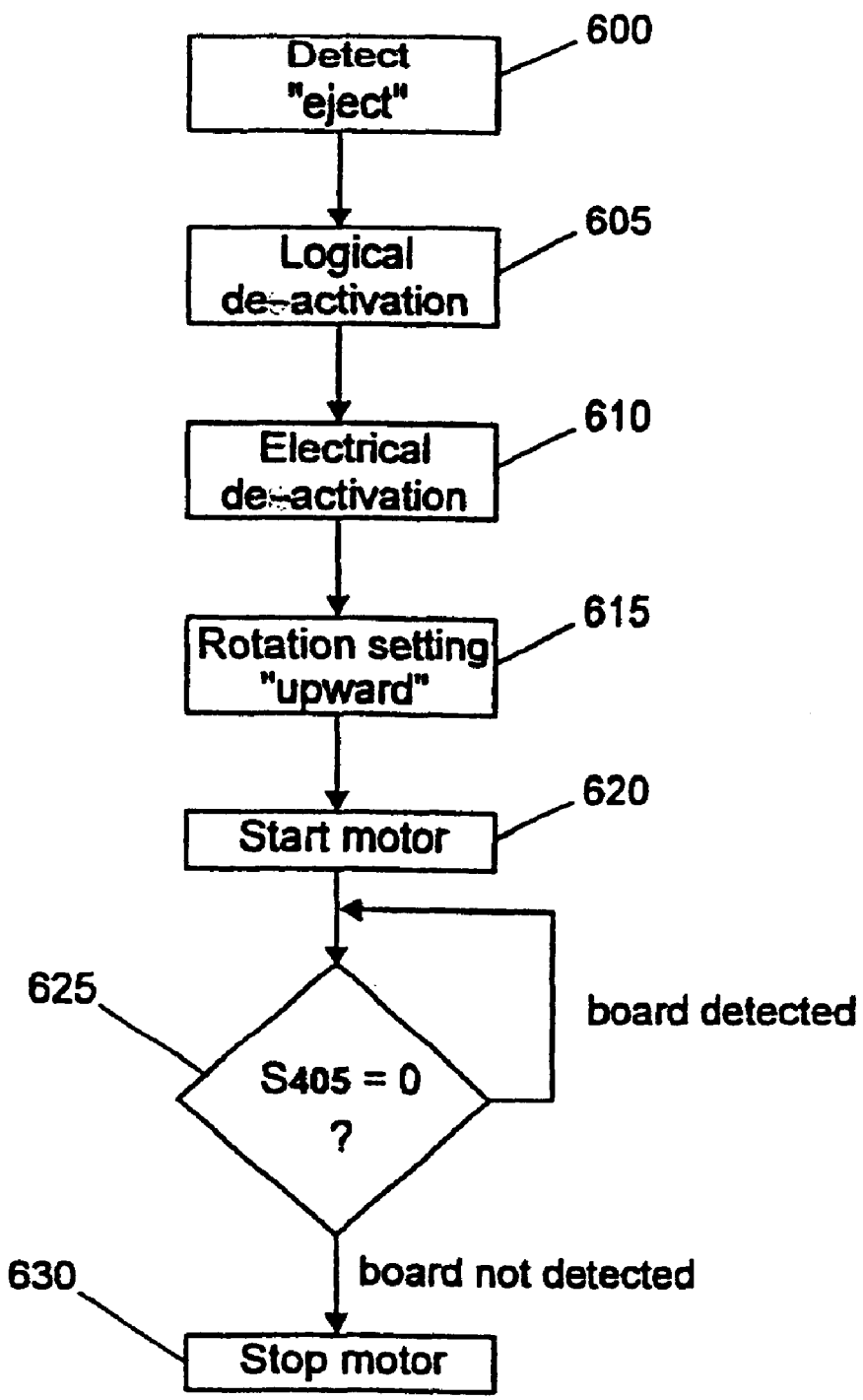
FIG. 6 shows the steps of the algorithm that illustrates the method of the invention to remove a PCB from such a structure.

FIG. 6 illustrates the main steps of the algorithm for one embodiment of the method of the invention to extract a PCB. The apparatus user pushes an "eject" button (step 600), causing the PCB to be deactivated (steps 605 and 610 respectively). Then the rotation direction for shaft 140 is set as "upward" (step 615) and motor 300 now starts (step 620). A loop is also provided here to assure complete PCB extraction (step 625), e.g., to cause shafts 130-1 and 130-2 to be unscrewed from the tapped holes, until switch 405 detects that threaded part of shafts 130-1 and 130-2 are fully unscrewed from these tapped holes. At this point, switch 405 is of a value equal to 0 (step 630).

Figure 7C:
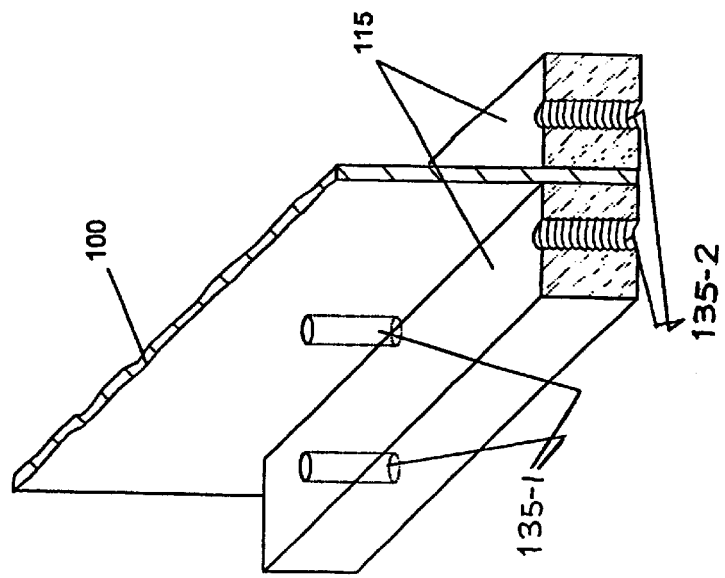
FIGS. 7a–7c show several examples of connectors that may be used in conjunction with the apparatus depicted in FIG. 1.
Figure 7B:
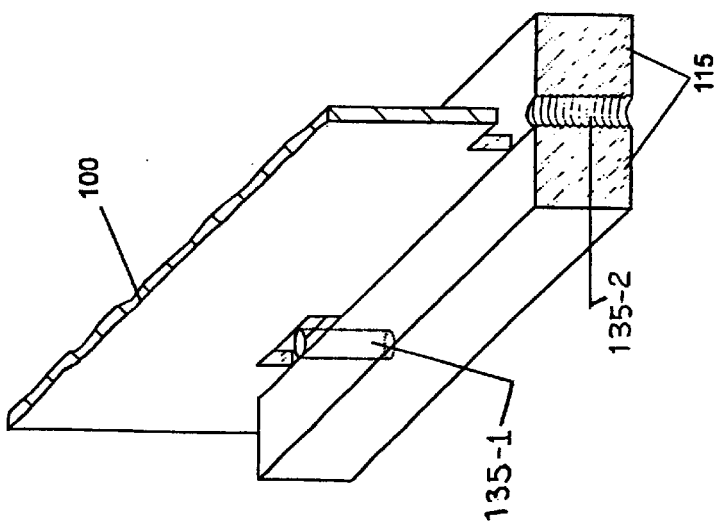
Figure 7A:
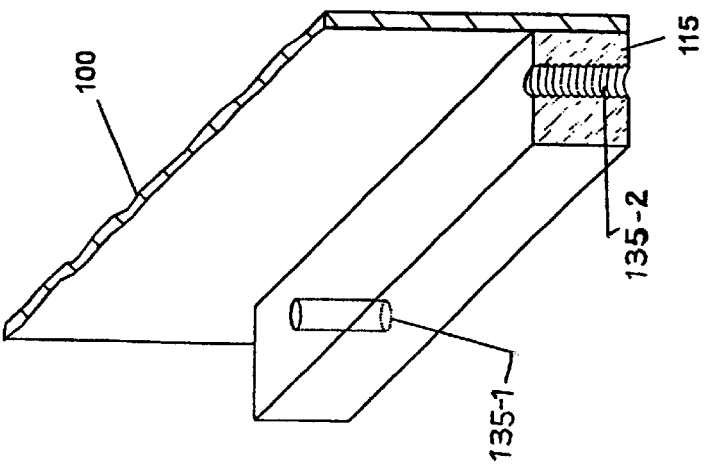

FIGS. 7a, 7b and 7c illustrate partial perspective views of different kinds of connectors that can be used with the invention. FIG. 7a represents the type of connector 115 shown in FIGS. 1, 2 and 4 that is located on a side of PCB 100. As disclosed, this connector comprises two tapped holes 135-1 and 135-2. FIG. 7b shows a PCB that comprises two connectors 115 arranged symmetrically on each side of the PCB. Such an arrangement obviously increases the total electrical contact number. The tapped holes 135-1 and 135-2 used to insert and extract PCB 100 are disposed between the two connectors 115 so that any relatively strong forces required to insert or extract the PCB are more uniformly distributed along the PCB. Finally, FIG. 7c illustrates the embodiment in which two connectors 115 are positioned on opposite surfaces of PCB 100, each including its own pair of holes 135-1 and 135-2. This arrangement also reduces (distributes) the insertion and extraction forces relative to PCB 100.

While there have been shown and described what are at present the preferred embodiments of the invention, it will be obvious to those skilled in the art that various changes and modifications may be made therein without departing from the scope of the invention as defined by the appended claims.

What is claimed is:

1. An apparatus for positioning a printed circuit board (PCB) within a housing and for removing said PCB from said housing, said PCB including at least one connector positioned thereon and having at least one threaded opening therein, said housing including at least one connector positioned therein and adapted for electrically connecting to said at least one connector of said PCB when said PCB is positioned within said housing, said apparatus comprising:

a control shaft adapted for being rotatively moved in first and second opposing directions; and at least one threaded shaft operatively coupled to said control shaft and adapted for being screwed into said at least one threaded opening in said at least one connector on said PCB during movement of said control shaft in said first direction to draw said PCB toward said at least one connector in said housing such that said at least one connector on said PCB will be electrically connected to said at least one connector within said housing, said at least one threaded shaft also adapted for being unscrewed from said at least one threaded opening during movement of said control shaft in said second direction to move said PCB away from said at least one connector within said housing such that said PCB will be disconnected from said at least one connector within said housing.

2. The apparatus of claim 1 wherein the number of said threaded shafts is two and the number of said threaded openings in said at least one connector on said PCB is two.

3. The apparatus of claim 1 wherein said at least one connector on said PCB is positioned on one side of said PCB adjacent a lower edge of said PCB.

4. The apparatus of claim 1 wherein the number of PCB connectors is two, each of said connectors being positioned on a side of said PCB opposite the other of said connectors.

5. The apparatus of claim 1 wherein said at least one threaded shaft includes a plurality of longitudinal channels therein and said control shaft includes a plurality of threads therein, said plurality of threads engaging said longitudinal channels to cause movement of said threaded shaft.

6. The apparatus of claim 1 further including a motor coupled to said control shaft.

7. The apparatus of claim 6 further including a mechanical clutch coupling said control shaft and said motor.

8. The apparatus of claim 1 further including a detection member for detecting when said at least one connector of said PCB is electrically coupled to said at least one connector within said housing.

9. The apparatus of claim 8 wherein said detection member is a depressible switch which is engaged by said PCB when said PCB is substantially fully inserted within said housing.

10. A method of positioning a PCB within a housing and for removing said PCB from said housing wherein said PCB includes at least one connector positioned thereon, said method comprising:

providing a backplane PCB within said housing;

positioning at least one connector on said backplane PCB;

providing said at least one connector on said PCB with a threaded opening;

providing at least one threaded shaft within said housing; and screwing said threaded shaft into said threaded opening to position said PCB within said housing and unscrewing said threaded shaft from within said threaded opening to remove said PCB from said housing.

11. The method of claim 10 further including providing a control shaft within said housing operatively coupled to said at least one threaded shaft to turn said threaded shaft to cause said screwing and unscrewing.

12. The method of claim 11 further including rotatively moving said control shaft in first and second opposing directions to in turn cause said threaded shaft to be screwed into or unscrewed from said threaded opening.

* * * * *